US011997789B2

(12) United States Patent
Schmidt et al.

(10) Patent No.: US 11,997,789 B2
(45) Date of Patent: May 28, 2024

(54) REDISTRIBUTION PLATE

(71) Applicant: Translarity, Inc., Fremont, CA (US)

(72) Inventors: Dominik Schmidt, Fremont, CA (US);
Prasanna Rao Chitturi, Fremont, CA (US); Jed Hsu, Fremont, CA (US)

( * ) Notice: Subject to any disclaimer, the term of this patent is extended or adjusted under 35 U.S.C. 154(b) by 0 days.

(21) Appl. No.: 17/971,821

(22) Filed: Oct. 24, 2022

(65) Prior Publication Data
US 2023/0054628 A1    Feb. 23, 2023

Related U.S. Application Data

(63) Continuation of application No. 17/144,087, filed on Jan. 7, 2021, now Pat. No. 11,510,318.

(60) Provisional application No. 62/958,141, filed on Jan. 7, 2020.

(51) Int. Cl.
| H05K 1/11 | (2006.01) |
| G01R 1/04 | (2006.01) |
| H05K 1/02 | (2006.01) |
| H05K 3/00 | (2006.01) |
| H05K 3/04 | (2006.01) |
| H05K 3/42 | (2006.01) |
| H05K 3/24 | (2006.01) |
| H05K 3/36 | (2006.01) |

(52) U.S. Cl.
CPC .......... *H05K 1/116* (2013.01); *G01R 1/0441* (2013.01); *H05K 1/0266* (2013.01); *H05K 1/111* (2013.01); *H05K 3/0029* (2013.01); *H05K 3/0032* (2013.01); *H05K 3/045* (2013.01); *H05K 3/423* (2013.01); *H05K 3/244* (2013.01); *H05K 3/368* (2013.01); *H05K 2201/094* (2013.01); *H05K 2201/09609* (2013.01); *H05K 2201/09672* (2013.01); *H05K 2203/025* (2013.01); *H05K 2203/0353* (2013.01); *H05K 2203/072* (2013.01); *H05K 2203/0723* (2013.01); *H05K 2203/0766* (2013.01); *H05K 2203/095* (2013.01)

(58) Field of Classification Search
CPC ................... H05K 1/11–1/115; H05K 1/0268
See application file for complete search history.

(56) References Cited

U.S. PATENT DOCUMENTS 6,162,997 A * 12/2000 Memis ................ H01L 23/5384
361/767

\* cited by examiner

*Primary Examiner* — Jeremy C Norris
(74) *Attorney, Agent, or Firm* — Shapiro IP Law; Joseph Shapiro

(57) ABSTRACT

A single-layer redistribution plate functioning as a space translator between a device under testing ("DUT") and a testing PCB may comprise a hard ceramic plate. A DUT side of the plate may have pads configured to interface with a device under testing. Both sides of the plate may comprise traces, vias, and pads to fan out the DUT pad pattern so that the plate side opposite the DUT side has spatially translated pads configured to interface with the pads on a testing PCB. Fabricating a redistribution plate may comprise calibrating and aligning, laser milling vias, laser milling trenches and pads, copper plating, grinding and polishing, removing residual copper, and coating the copper surfaces.

1 Claim, 13 Drawing Sheets

REDISTRIBUTION PLATE

BACKGROUND OF THE INVENTION

A space transformer is used in integrated circuit testing as an adapter or transition between the spatially dense test pads on a device under testing (DUI) and the less dense probe pads on the testing PCB. Colloquially, a space transformer "fans" out the spatially dense test outputs from the DUT into a manageable and less spatially dense set of test pads for input into a testing PCB, Or, in other words, a space transformer translates wafer-level pad pitch and feature dimensions to a larger pad pitch and/or feature dimensions usually that of a testing PCB, A space transformer is generally fabricated using one of two processes: multi-layer ceramic ("MLC") or multi-layer organic ("MLO"). Using the MLC approach, soft ceramic sheets are individually patterned and then combined into a single multi-layer substrate by firing the soft ceramic sheets together. Using the MLO approach, a multi-layer substrate is fabricated by adding one soft organic layer at a time, and, as each individual sheet is added, putting the necessary pattern on the just-added layer. MLC processes and MLO processes typically use large geometries/pitches for ease in fabricating each layer. This allows the fabricator to use easier/less expensive processes. The resultant space transformer is typically bulkier and requires more process steps/process time. Additionally, the additional process steps for MLC and MLO add cost and process lead time. In the case of MLO, an additional constraint is that a whole panel of space transformers is fabricated where the typical order is for only 1-3 pieces. In the semiconductor test marketplace, the business is centered on low-volume/high-mix. MLA) and MLC are expensive because they require multiple layers. MLO and MLC can also result in unnecessary material waste because if any layer is defective the entire unit must be discarded. Additionally, using MLO and MLC, a customized space transformer architecture must be designed and fabricated for each testing application.

What is needed is an improved space translator solution. Such improvement may be in smaller pitches and/or geometries; or in the need for less layers; or in a less complex, cheaper, or less error-prone fabrication process.

BRIEF SUMMARY OF THE INVENTION

BRIEF DESCRIPTION OF THE DRAWINGS

FIG. 1b shows a close-up view of the pads on the DUT in FIG. 1a.

DETAILED DESCRIPTION OF THE INVENTION

This Application claims priority to and is a continuation of U.S. Non-provisional application Ser. No. 17/144,087 titled "Redistribution Plate," filed on Jan. 7, 2021, the first inventor of which is Dominik Schmidt, and which is incorporated herein by reference in its entirety. Application Ser. No. 17/144,087 claims priority to U.S. Application Ser. No. 62/958,141, titled "SINGLE LAYER. REDISTRIBUTION PLATE," filed on Jan. 7, 2020, the first inventor of which is Dominik Schmidt, and which is incorporated herein by reference in its entirety.

A system and method are disclosed for a redistribution plate or space translator.

As used herein the unit of measurement "um" refers to a micrometre, i.e., one millionth of a meter.

Table of Reference Numbers from Drawings:

The following table is for convenience only and should not be construed to supersede any potentially inconsistent disclosure herein.

| Reference Number | Description |
| --- | --- |
| 100 | DUT |
| 110a-n | DUT pads |
| 112a-n | DUT pads |
| 114a-n | DUT pads |
| 116a-n | DUT pads |
| 200 | testing PCB |
| 210a-n | test probe pads |
| 212a-n | test probe pads |
| 214a-n | test probe pads |
| 216a-n | test probe pads |
| 300 | redistribution plate |
| 330 | bottom (DUT) side of redistribution plate |
| 335a-n | DUT interface pads for fanning out on DUT side 330 of redistribution plate 300 |
| 340a-n | DUT interface vias for fanning out on testing PCB side of redistribution plate |
| 345a-n | traces on DUT side 330, running from pads 335a-n to vias 350a-n |
| 350a-n | vias connecting traces 345a-n on DUT side 330 to pads |
| 360 | top (testing PCB) side of redistribution plate |
| 365a-n | vias corresponding to vias 340a-n for fanning out on testing PCB side 360 of redistribution plate 300 |
| 375a-n | traces on test PCT side 360, running from vias 365a-n to |

Figure 1A:
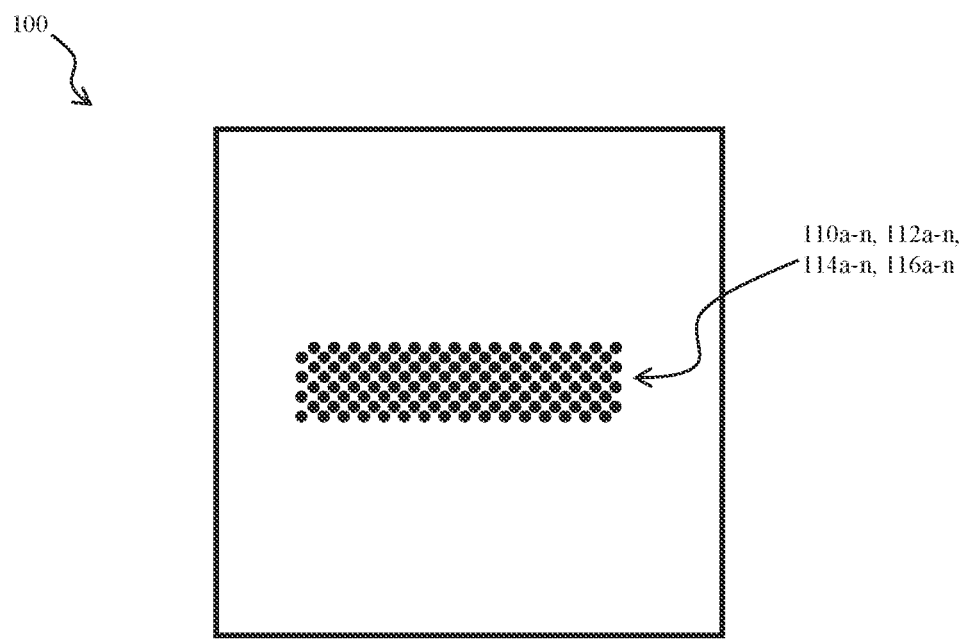
FIG. 1a illustrates an exemplary DUT with pads.
Figure 1B:
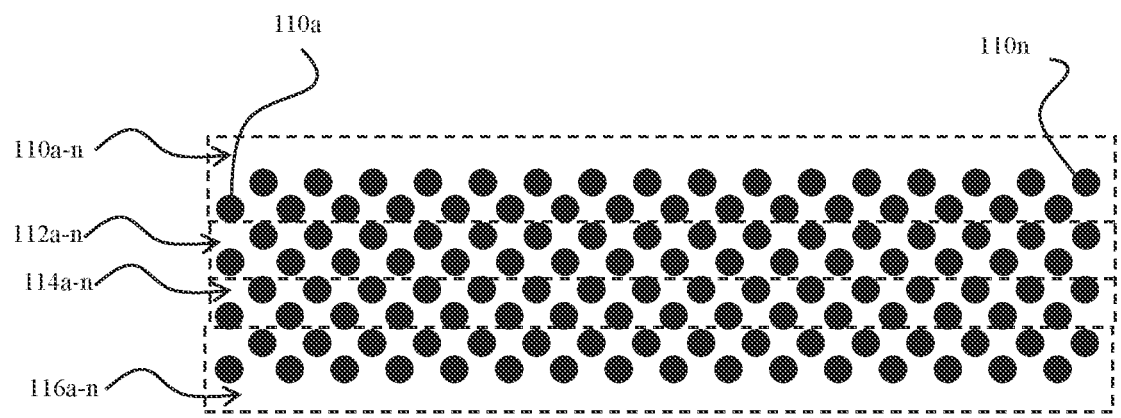

| Reference Number | Description |
|---|---|
| | pads 380a-n |
| 380a-n | pads connecting vias 365a-n by traces 375a-n, and for interfacing with pads 212a-n on testing PCB 200 |
| 385a-n | pads on testing PCB side 360, connecting to vias 350a-n on DUT side 330, and for interfacing with test probe pads 210a-n on testing PCB 200 |
| 500 | DUT side of redistribution plate showing fanning out for all pads (110a-n, 112a-n, 114a-n, and 116a-n) in FIGS. 1a and 1b |
| 600 | testing PCB side of redistribution plate showing fanning out for all pads (110a-n, 112a-n, 114a-n, and 116a-n) in FIGS. 1a and 1b |
| 700 | exemplary DUT for multi-layer embodiment |
| 750a-n | pad pattern on DUT 700 |
| 800 | first redistribution plate for multi-layer embodiment |
| 830 | DUT side of first redistribution plate 800 |
| 835a-n | DUT interface pads for fanning out on DUT side 830 of redistribution plate 800 |
| 840a-n | DUT interface vias for fanning out on testing PCB side 860 of redistribution plate 800 |
| 845a-n | traces on DUT side 830, running from pads 835a-n to vias 850a-n |
| 850a-n | vias connecting traces 845a-n on DUT side 830 to pads on testing PCB side 860 |
| 860 | testing PCB side of first redistribution plate 800, configured for DUT side 930 of second redistribution plate 900 |
| 865a-n | vias corresponding to vias 840a-n for fanning out on testing PCB side 860 of redistribution plate 800 |
| 875a-n | traces on test PCT side 860, running from vias 865a-n to pads 880a-n |
| 880a-n | pads connecting vias 865a-n by traces 875a-n, and for interfacing with pads on testing PCB 1000 |
| 885a-n | pads on testing PCB side 860, connecting to vias 850a-n on DUT side 830, and for interfacing with test probe pads on testing PCB 1000 |
| 1000 | second redistribution plate |
| 1030 | DUT side of second redistribution plate 900 |
| 1035a-n | DUT interface pads for fanning out on DUT side 1030 of redistribution plate 1000 |
| 1040a-n | DUT interface pads/vias for fanning out on testing PCB side 1160 of redistribution plate 1100 |
| 1045a-n | traces on DUT side 830, running from pads 1035a-n to pads/vias 1050a-n |
| 1050a-n | pads/vias connecting traces 1045a-n on DUT side 1030 to pads on testing PCB side 1060 |
| 1060 | testing PCB side of second redistribution plate 900 |
| 1065a-n | pads/vias corresponding to pads/vias 1040a-n for fanning out on testing PCB side 1060 of redistribution plate 1000 |
| 1075a-n | traces on test PCT side 860, running from pads/vias 1065a-n to pads 1080a-n |
| 1080a-n | pads connecting padsvias 1065a-n by traces 1075a-n, and for interfacing with pads on testing PCB 1100 |
| 1085a-n | pads on testing PCB side 1060, connecting to pads/vias 1050a-n on DUT side 1030, and for interfacing with test probe pads on testing PCB 1100 |
| 1100 | exemplary testing PCB for multi-layer embodiment |
| 1150 | pads on testing PCB 1000 |
| 1300 | cross section of multi-layer embodiment |
| 1302 | DUT |
| 1303 | DUT pad |
| 1304 | DUT pad |
| 1310 | first layer redistribution plate |
| 1311 | Pad on redistribution plate 1310 or interfacing with DUT 1302 |
| 1312 | Pad on redistribution plate 1310 for interfacing with DUT 1302 |
| 1313 | via |
| 1314 | via |
| 1315 | trace |
| 1316 | trace |
| 1317 | pad |
| 1318 | pad |
| 1319 | gold bump |
| 1320 | gold bump |
| 1321 | pad |
| 1322 | pad |
| 1330 | second-layer redistribution plate |
| 1331 | trace |
| 1332 | trace |
| 1333 | via |
| 1334 | via |
| 1335 | pad |
| 1336 | pad |
| 1337 | gold bump |
| 1338 | gold bump |
| 1339 | pad |
| 1340 | pad |
| 1350 | third-layer redistribution plate |
| 1351 | via |
| 1352 | via |
| 1353 | trace |
| 1354 | trace |
| 1355 | pad |
| 1356 | pad |
| 1357, 1358 | ball grid array |
| 1400 | flow chart for fabricating redistribution plate |
| 1410 | step in flow chart 1400 |
| 1420 | step in flow chart 1400 |
| 1430 | step in flow chart 1400 |
| 1440 | step in flow chart 1400 |
| 1450 | step in flow chart 1400 |
| 1460 | step in flow chart 1400 |
| 1470 | step in flow chart 1400 |
| 1480 | step in flow chart 1400 |

A system and method are disclosed for an improved redistribution plate (which may also be referred to as a "space translator" or "space transformer") for use in testing circuit devices. This disclosure refers to the device being tested as a "device under testing" or "DUT."

In the disclosure herein, "redistribution plate" refers to a space transformer, and is generally used to reference a space transformer as disclosed herein.

A DUT is an electronic device such as a microchip or other electronic circuit. A DUT includes pads that may be used for interfacing with another device (e.g., a DUT may eventually be installed on a larger circuit board and may interface with such larger circuit board through one or more pads) and/or for testing.

A DUT may have may many shapes, sizes, designs, and/or pad patterns. In one embodiment, a DUT may be a square that is approximately 60 mm on each side. DUT sizes may vary, e.g., from a square 10 mm on each side to a square 100 mm on each side. A DUT may have other shapes and sizes.

The figures included with this disclosure and referenced herein are not intended to be exact representations of the scale, dimensions, and relative component sizes as described herein below, but are instead intended to show general placement patterns, dimensions, and relative sizes in a manner that is comprehendible notwithstanding that some of the components are very small. Component placement, patterns, sizes, density/pitch, and dimensions may be adjusted within the skill of a person of ordinary skill in the art. Such adjustments—which will likely and inevitably be necessary for a specific implementation of the technology and invention disclosed herein—are within the scope of this disclosure.

Apparatus

FIG. 1a shows an exemplary DUT 100 with pads 110a-n, 112a-n, 114a-n, and 116a-n.

FIG. 1 shows the pad pattern for an exemplary DUT 100. As shown in FIG. 1, DUT 100 include pads 110a-n, 112a-n, 114a-n, and 116a-n, which may be organized or patterned as eight rows of sixteen pads per row, organized as shown in the FIG. 1. The pattern and placement of pads 110a-n, 112a-n, 114a-n, and 116a-n may vary widely. A person of ordinary skill will appreciate that that the disclosure herein may be modified or adjusted to apply to a wide variety of DUT pad organizations, patterns, sizes, dimensions, and pitches. In one exemplary embodiment, DUT pads 110a-n, 112a-n, 114a-n, and 116a-n may have a diameter of 30 um and a pitch of 100 um.

Although many variations are known in the art, in general a DUT is tested by electrically connecting the DUT pads to a testing PCB, either directly or indirectly. When the DUT pads are connected to the testing PCB, the testing PCB runs a testing procedure and regimen by sending electrical signals to, and receiving electrical signals from, the DUT. The redistribution plate disclosed herein is an adapter between the DUT pads and the interconnect pads on a testing PCB.

Figure 2:
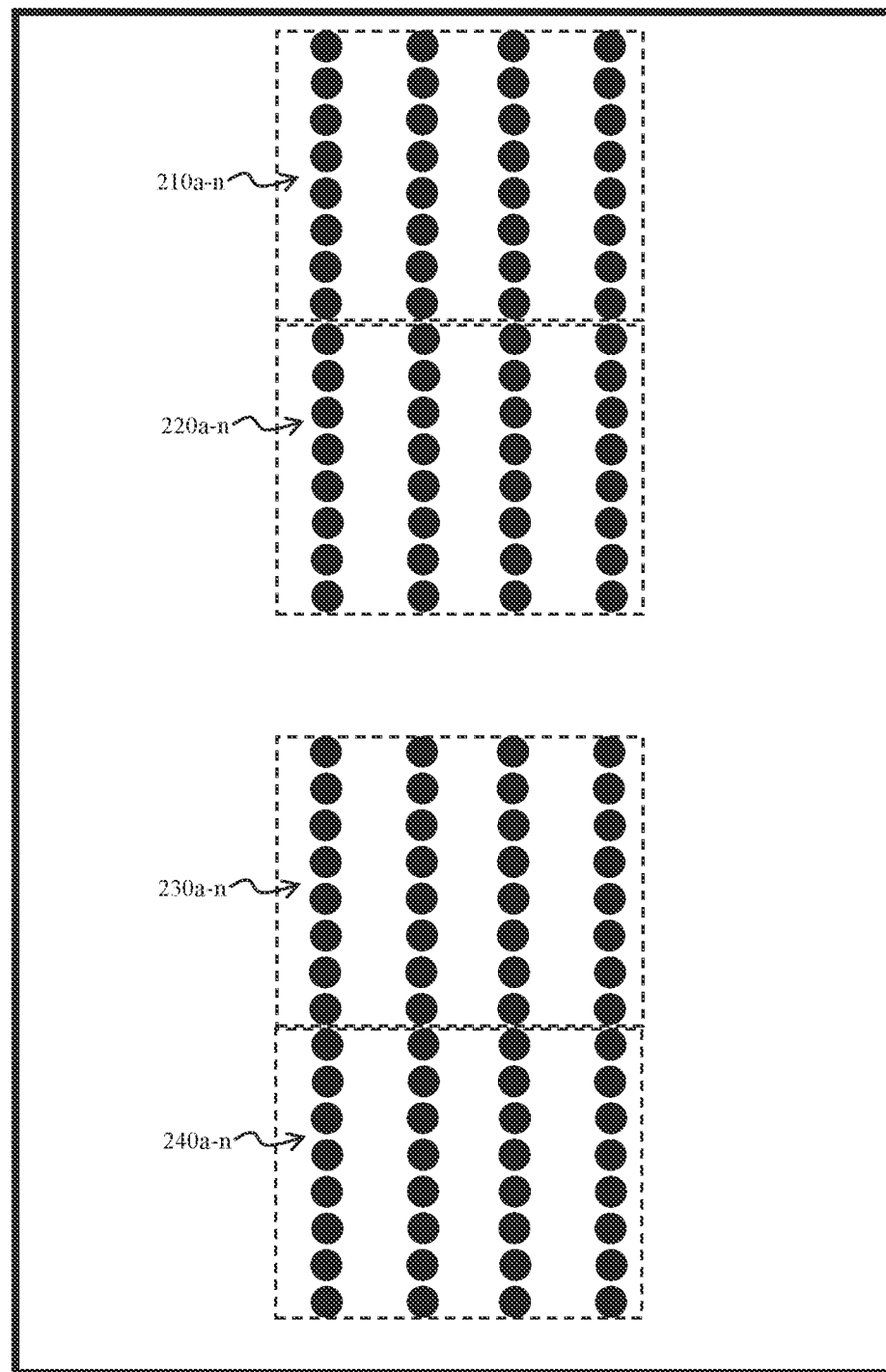
FIG. 2 shows an exemplary testing PCB and the pads on the exemplary testing PCB.

FIG. 2 shows the test probe layout on an exemplary testing PCB 200. In one embodiment, as shown in FIG. 2, the test interconnect pads 210a-n, 220a-n, 230a-n, and 240a-n on testing PCB 200 may be arranged as shown in FIG. 2, may be made of copper with protective coatings of nickel and gold, may be circular with an approximate diameter of 420 um, and may have a pitch of 650 um. As will be appreciated by a person of ordinary skill in the art, other materials may be used for the test interconnect pads.

Redistribution plate 300 may comprise a premade hard ceramic plate made at least in part from silicon nitride or other ceramics, polymeric materials such as FR4, quartz, or similar materials suitable for a substrate known in the art.

Figure 3:
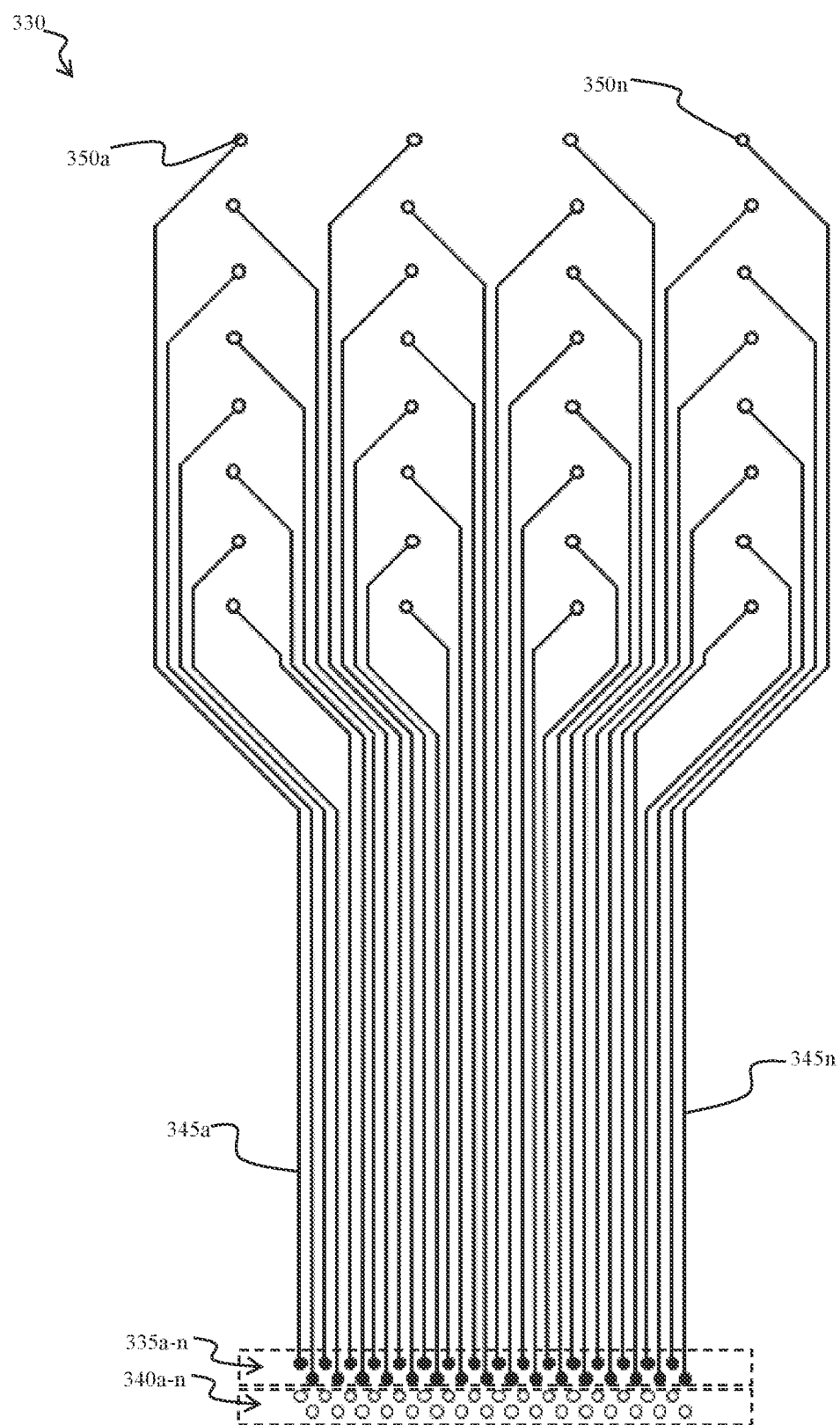
FIG. 3 shows the feature layout on the DUT side of an exemplary redistribution plate for the top four rows of pads on the DUT in FIGS. 1a and 1b.
Figure 4:
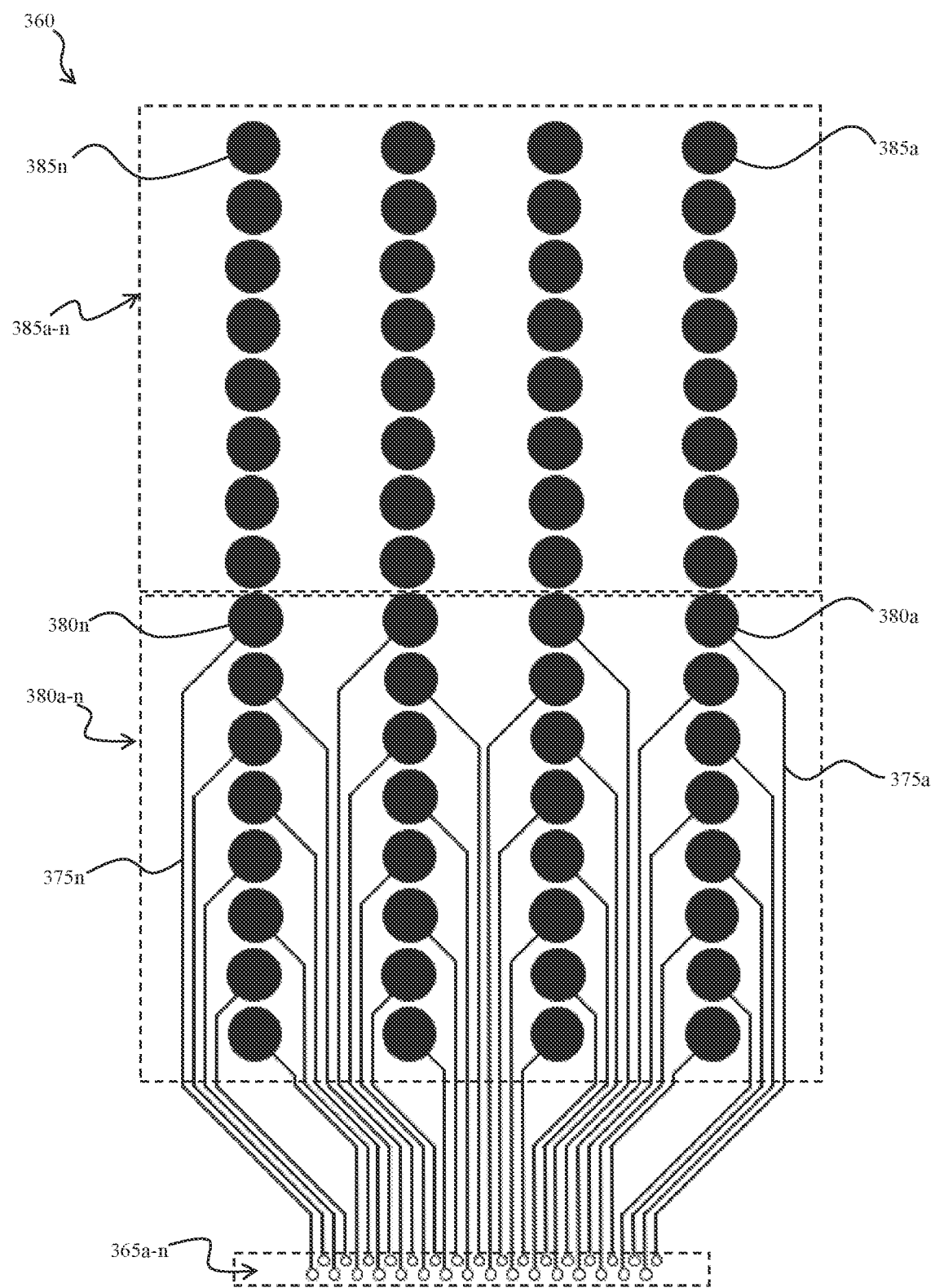
FIG. 4 shows the feature layout on the testing-PCB side of an exemplary redistribution plate for the top four rows of pads on the DUT in FIGS. 1a and 1b.

As shown in FIGS. 3 and 4, redistribution plate 300 may have two sides: DUT side 330, and testing-PCB side 360. FIG. 3 shows the feature layout and pattern on DUT side 330. FIG. 4 shows the feature layout and pattern on DUT side 360.

DUT side 330 of redistribution plate 300 may have pads 335a-n and vias 340a-n configured to match pads 110a-n and 112a-n, respectively, on DUT 100. Testing-PCB side 360 of redistribution plate 300 may have vias 365a-n corresponding to vias 340a-n on DUT side 330 of redistribution plate 300.

The pads on testing PCB 200 and redistribution plate 300, as well as on the other testing PCBs and redistribution plates disclosed herein, may be BGA (ball grid array), wire-bonded, or any other connection solution or approach known in the art.

As shown in FIG. 3, DUT side 330 of redistribution plate 300 may include traces 345a-n for connecting pads 335a-n to vias 350a-n. Vias 350a-n go through redistribution plate 300 and connect to pads 385a-n on testing PCB side 360 of redistribution plate 300. Because the features on DUT side 330 and the corresponding features on testing-PCB side 360 are on opposite sides of the same redistribution plate 300, the features on testing-PCB side 360 that correspond to the features on DUT side 330 are reflected around a vertical axis (e.g., pad 385n on testing-PCB side 360 appears on the upper left of FIG. 4, but the corresponding feature on DUT side 330, which is connected by a via, appears on the upper right of FIG. 3.

FIG. 3 also shows vias 340a-n, which are configured to interface with pads 112a-n on DUT 100, Vias 340a-n go through redistribution plate 300 and connect with vias 365a-n on testing-PCB side 360 of redistribution plate 300.

As shown in FIG. 4, vias 365a-n, which go through redistribution plate 300 to vias 340a-n on DUT side 330 of redistribution plate 300, are connected to pads 380a-n by traces 375a-n. FIG. 4 also shows pads 385a-n, which are connected to vias 350a-n on DUT side 330 of redistribution plate 300.

Depending on constraints relating to size, spacing, pattern, and density of other features and traces, trace widths may range in size. In some embodiments, some traces, or segments of some traces, may be 15 um. As is well-known in the art, resistance characteristics of a trace change with the width of the trace, and it is therefore generally desirable to keep traces as wide as possible to decrease resistance and also for ease in fabrication. Depending on a particular implementation or application, trace widths may be configured to be as wide as possible except where necessary to avoid other features. Additionally, in some embodiments, it may be beneficial to use narrow trace width segments only on shorter traces, thereby avoiding undesirable resistance characteristics.

Using this scheme of "fanning out" as shown in FIGS. 3 and 4, a dense pattern of small pads 110a-n and 112a-n on DUT 100 may be spatially distributed to larger and less dense pads 385a-n and 380a-n, where pads 385a-n and 380a-n match pads 210a-n and 220a-n on testing PCB 200, This accomplishes a translation or redistribution of the spatial and dimensional characteristics of pads 1 10a-n and 112a-n on DUT 100 to the spatial and dimensional characteristics of pads 210a-n and 220a-n on testing PCB 200. The translation could include feature size, density, feature shape, and/or spatial pattern/organization. Use of redistribution plate 300 facilitates less expensive and complex design and fabrication of testing PCB 200. Additionally, the design disclosed herein is simpler and has lower total thickness.

Figure 5:
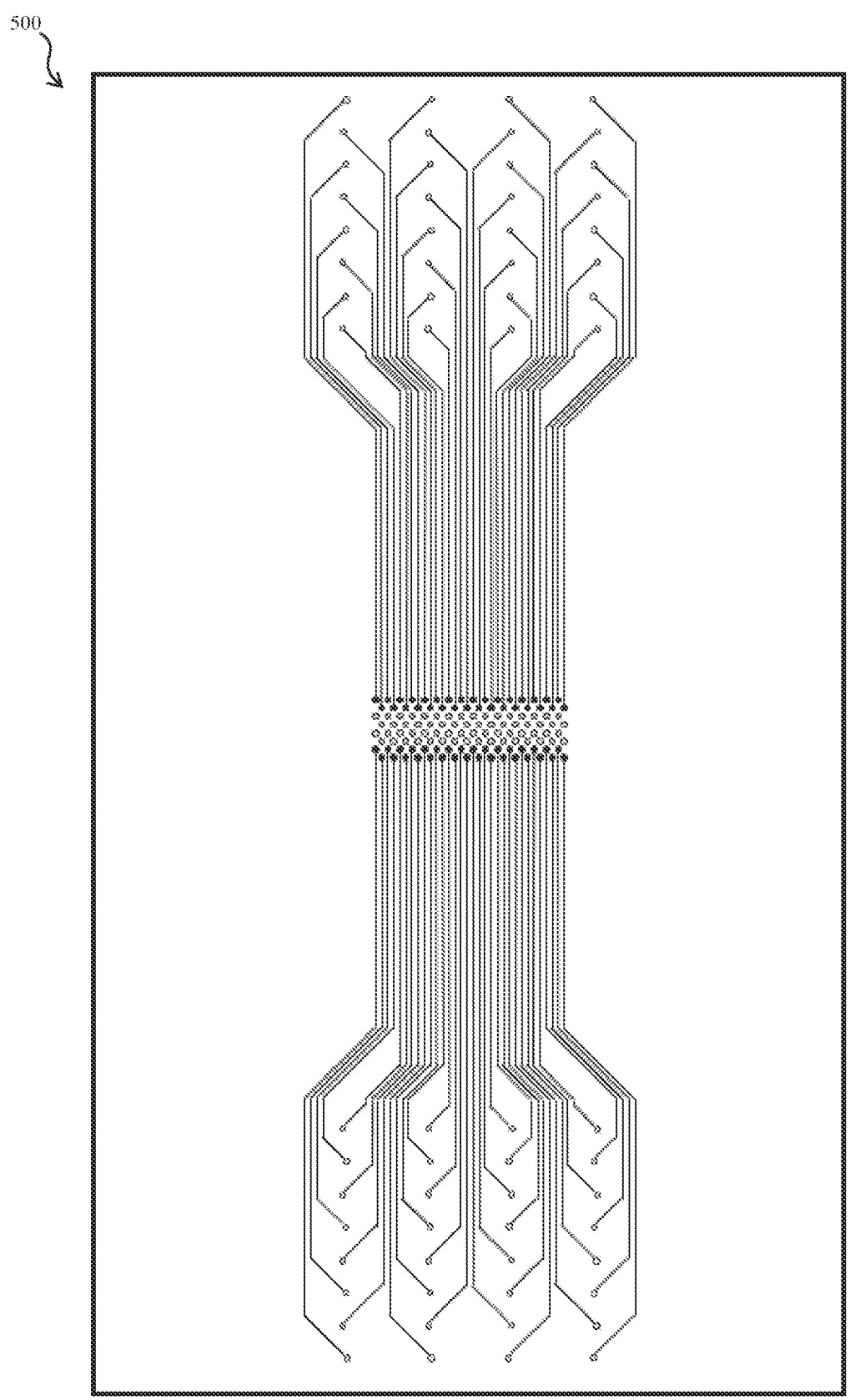
FIG. 5shows the feature layout of the DUT side of an exemplary redistribution plate for all of the pads shown in the DUT in FIGS. 1a and 1b.
Figure 6:
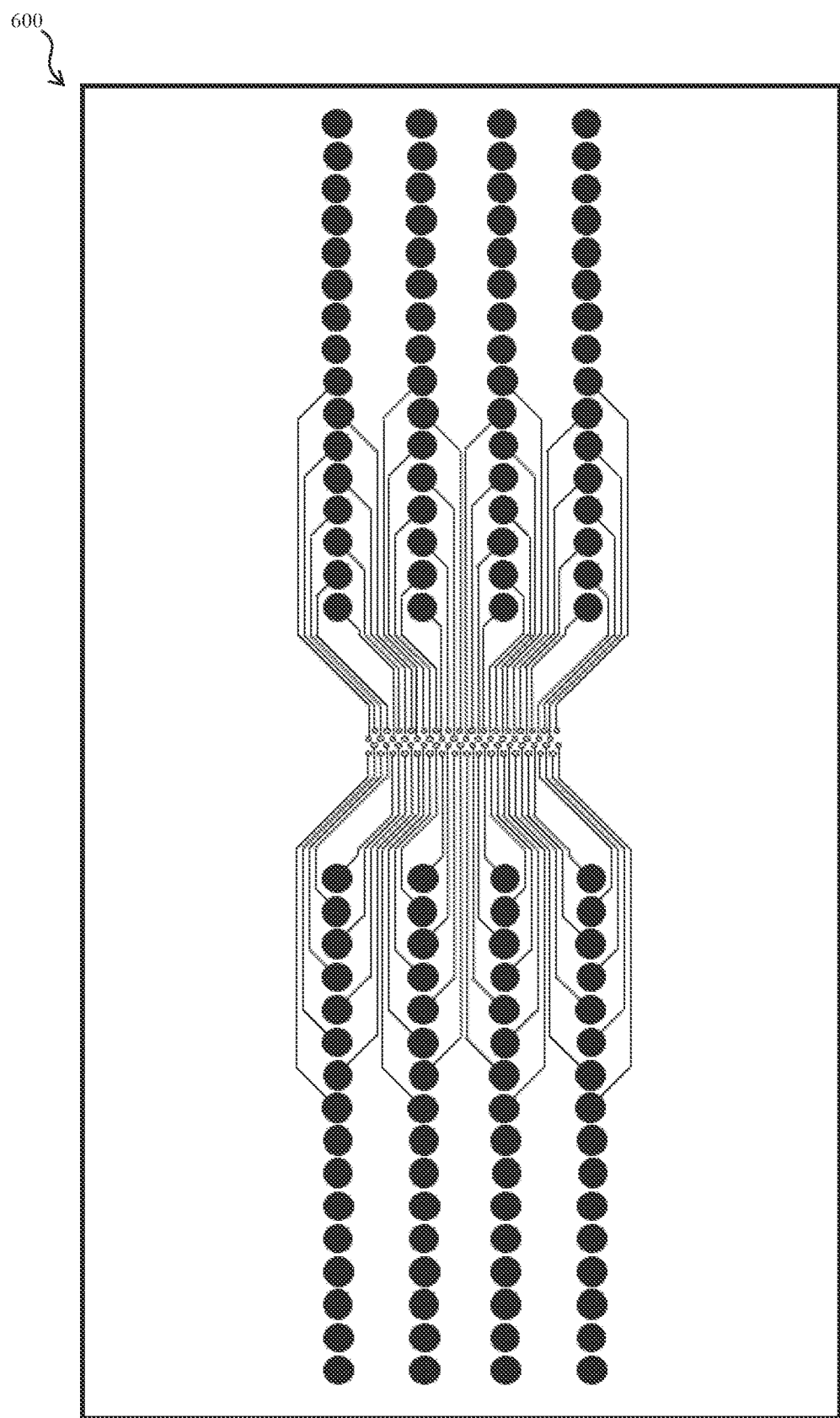
FIG. 6 shows the feature layout of the testing-PCB side of an exemplary redistribution plate for all of the pads shown in the DUT in FIGS. 1a and 1b.

FIGS. 5 and 6 are similar to FIGS. 3 and 4, respectively, except that FIGS. 5 and 6 show an exemplary fanning out design for all of the pads 110a-n, 112a-n, 114a-n, and 116a-n in DUT 100 in FIG. 1, whereas FIGS. 3 and 4 show an exemplary fanning out design for only pads 110a-n and 112a-n in DUT 100 from FIG. 1. FIG. 5 shows an exemplary DUT side 500 of a redistribution plate 300 for pads 110a-n, 112a-n, 114a-n, and 1116a-n in DUT 100. FIG. 6 shows an exemplary testing-PCB side 600 of a redistribution plate 300 for pads 110a-n, 112a-n, 114a-n, and 116a-n in DUT 100.

In many space transformer applications, a single-layer redistribution plate as described herein will be sufficient, e.g., to replace an MLO or MLC space transformer. In the rare circumstance in which a single-layer redistribution plate is not able to replace a MLO or MLC space transformer, a sequence or stack of single-layer redistribution plates may be used. For example, a first redistribution plate may be designed with probe pads on a DUT side that match the test probes of a DUT, and bonding pads on a testing-PCB side that match the input probes of a second redistribution plate. The second redistribution plate may have probe pads on a DUT side that match the bonding pads on the testing-PCB side of the first redistribution plate, and output bonding pads on the testing-PCB side that match the pads on a testing PCB.

For example, as shown in FIGS. 7-12, two redistribution plates may be stacked. as an interface between a DUT and a testing PCB. Any number of redistribution plates may be stacked. FIGS. 7-12 illustrate an embodiment using two redistribution plates.

Figure 7:
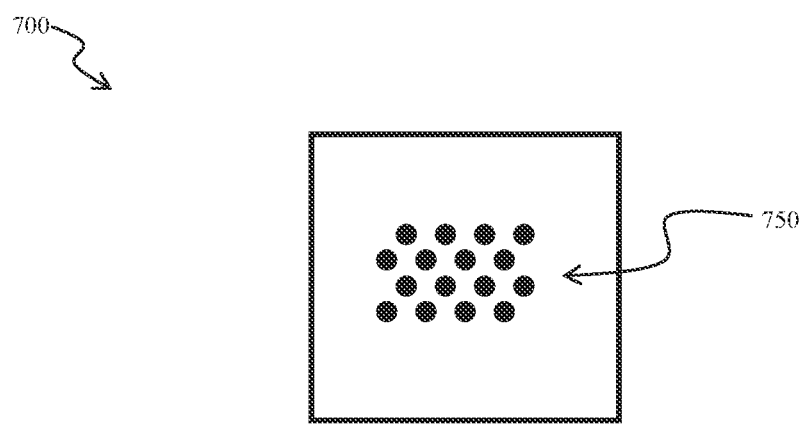
FIG. 7 illustrates an exemplary DUT with pads for use in describing a multi-layer implementation.

FIG. 7 shows an exemplary DUT 700 with pads 750. The feature sizes, dimensions, and densities in the multi-layer example in FIGS. 7-12 may be similar to the sizes, dimension, and densities described herein for the single-layer example.

Figure 8:
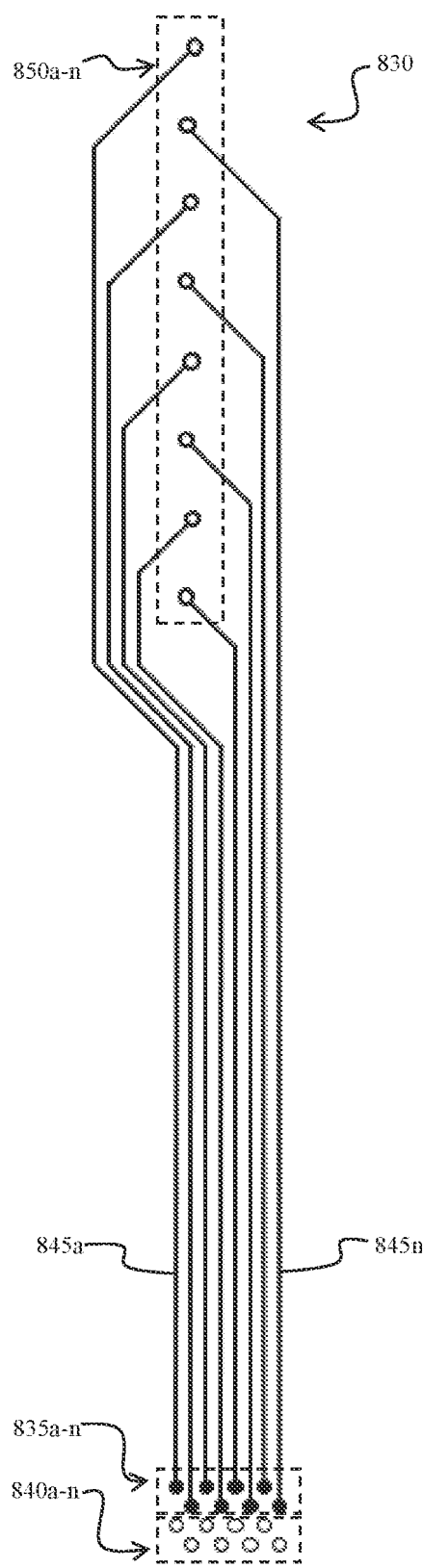
FIG. 8 shows the feature layout on the DUT side of an exemplary redistribution plate for the pads on the DUT in FIG. 7.
Figure 9:
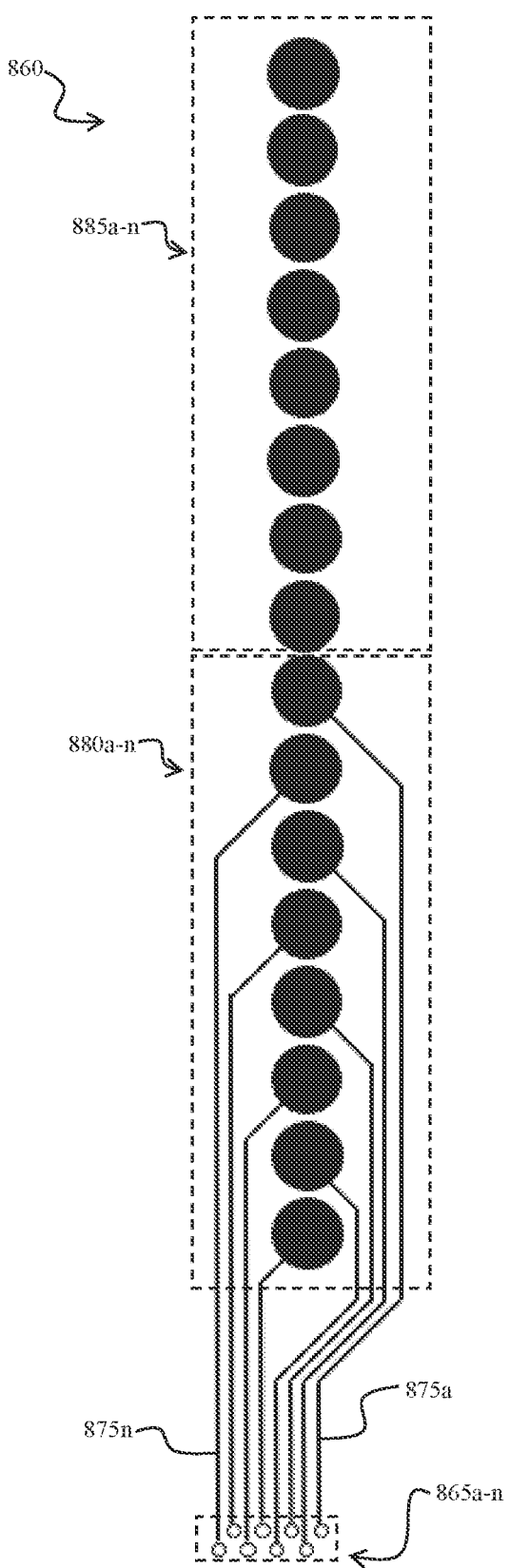
FIG. 9 shows the feature layout on the testing-PCB side of an exemplary redistribution plate for the pads on the DUT in FIG. 7.

FIG. 8 shows the feature layout on a DUT side 830 of a first redistribution plate 800. Other than the fact that first redistribution plate 800 has less features than redistribution plate 300, redistribution plate 800 and redistribution plate 300 have analogous features and characteristics. The features of redistribution plate 800, including DUT side 830 and testing PCB side 860 may be understood by reference to the detailed description herein for redistribution plate 300. FIG. 9 shows the feature layout on a testing-PCB side 860 of first redistribution plate 800. Testing-PCB side 860 is configured to interface with a second redistribution plate 1000 instead of a testing PCB.

Figure 10:
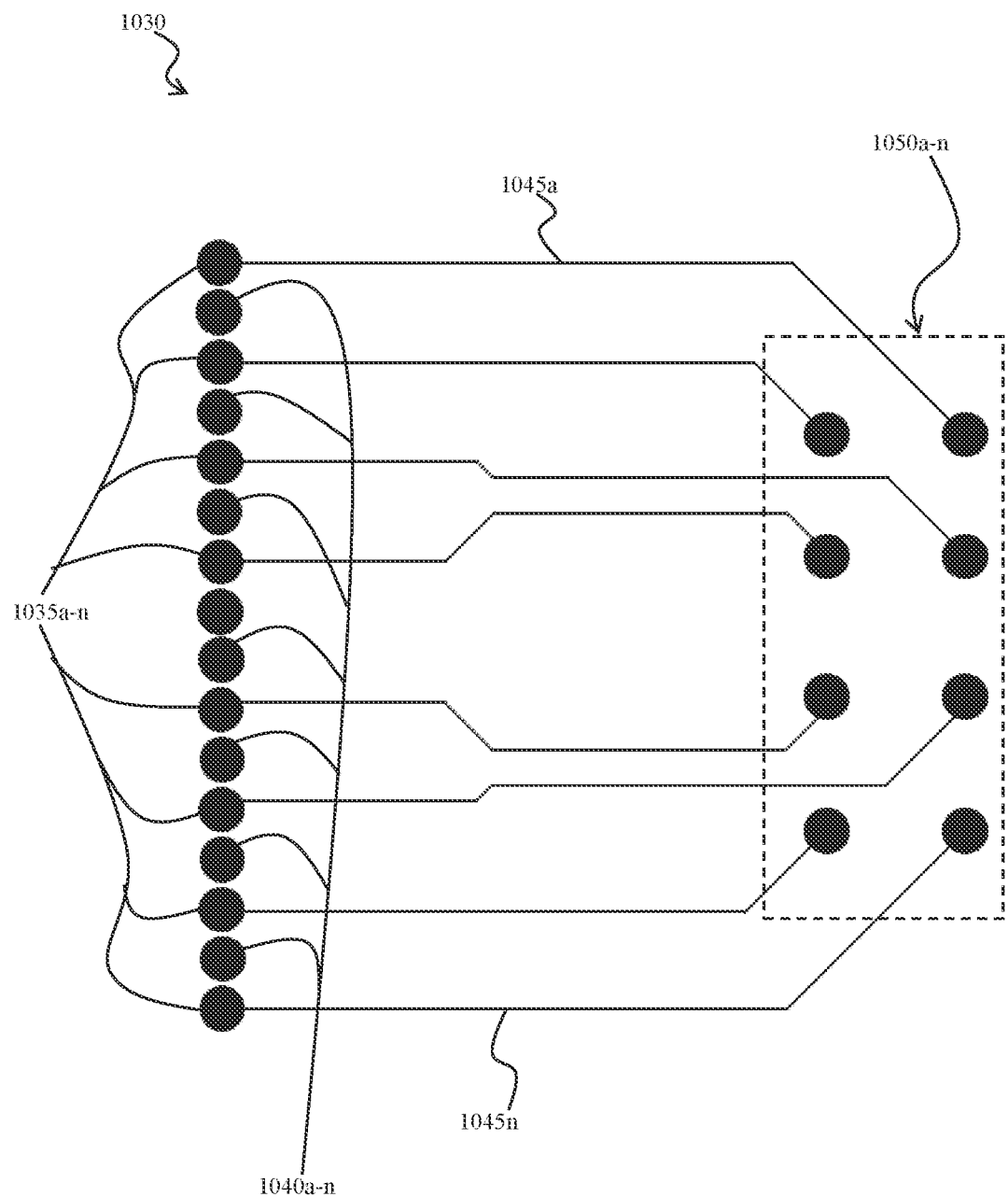
FIG. 10 shows the feature layout on the DUT side of an exemplary second-layer redistribution plate for the pads on the testing-PCB side of the redistribution plate in FIG. 9.
Figure 11:
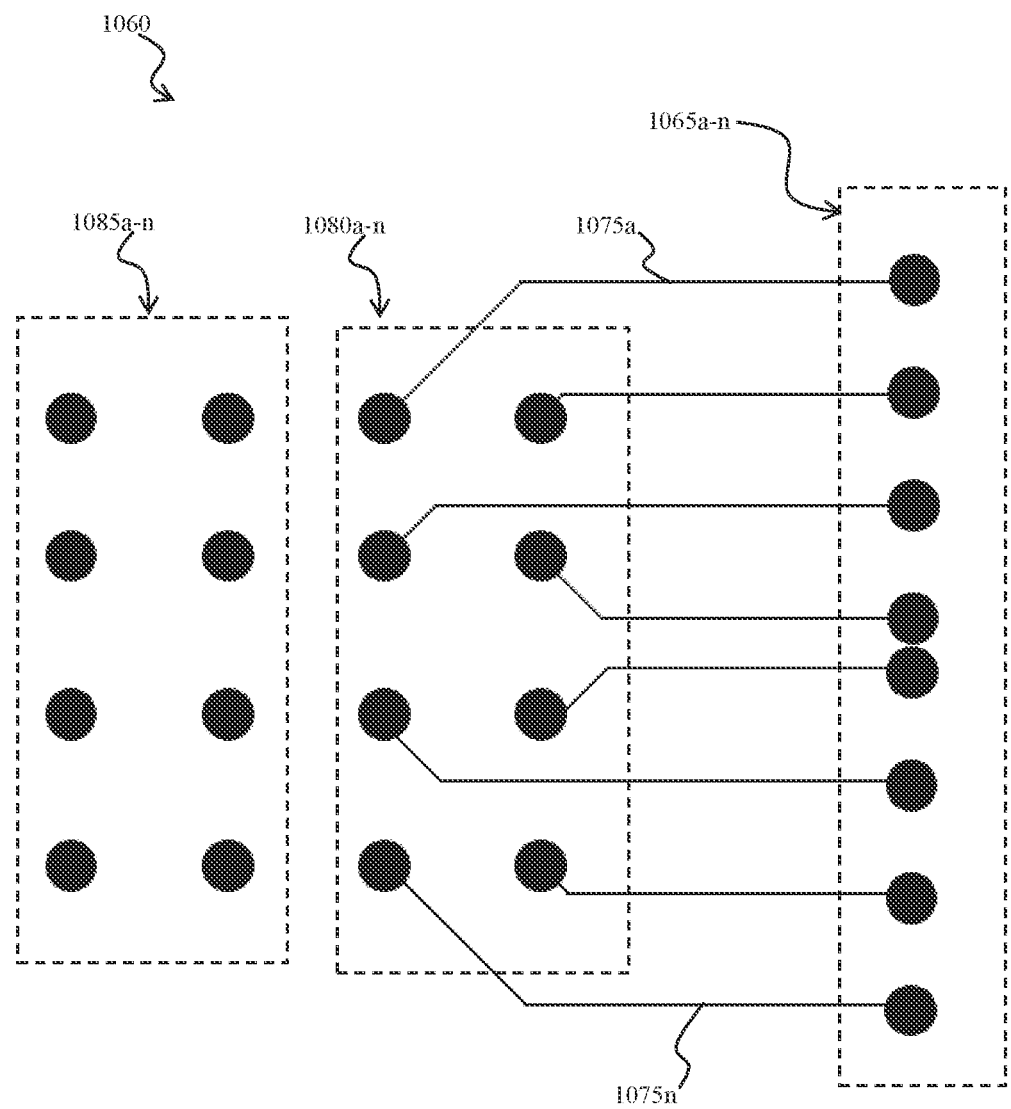
FIG. 11 shows the feature layout on the testing-PCB side of an exemplary second-layer redistribution plate for the pads on the testing-PCB side of the redistribution plate in FIG. 9.

FIGS. 10 and 11 show the feature layout of a DUT side 1030 and testing-PCB side 1060 of a second redistribution plate 1000. FIG. 10 shows the feature layout of DUT side 1030, and FIG. 11 shows the feature layout of testing-PCB side 1060. Redistribution plate 1000 is configured to interface with and function as an adapter between first redistribution plate 800 and testing PCB 1100 (shown in FIG. 12).

DUT side 1030 is configured to interface with testing-PCB side 860 of first redistribution plate 800. Pads 1035a-n and 1040a-n on DUT side 1030 match pads 885a-n and 880a-n on testing-PCB side 860 of first redistribution plate 800.

Testing-PCB side 1060 is configured to interface with testing PCB 1100. Pads 1080a-n and 1085a-n on testing-PCB side 1060 match pads 1150a-n on testing PCB 1100.

The design of redistribution plate 1000 is similar to redistribution plate 800 in that both use a two-sided configuration to space and relocate pads. As shown in FIG. 10, DUT side 1030 is configured so that pads 1035a-n are connected, by traces 1045a-n, to pads 1050a-n. As shown in FIG. 10, pads 1050a-n may have a different density, spacing pattern, and/or other characteristics relative to pads 1035a-n. Pads (or via) 1050a-n may be connected to vias that go through redistribution plate 1000 to pads 1085a-n on testing-PCB side 1060.

Pads 1040a-n on DUT side 1030 of redistribution plate 1000 may be connected to vias that go through redistribution plate 1000 to pads (or vias) 1065a-n on testing-PCB side 1060. Pads 1065a-n on testing-PCB side 1060 are connected, by traces 1075a-n, to pads 1080a-n. As shown in FIG. 11, 1050a-n may have a different density, spacing pattern, and/or other characteristics relative to pads 1065a-n.

Figure 12:
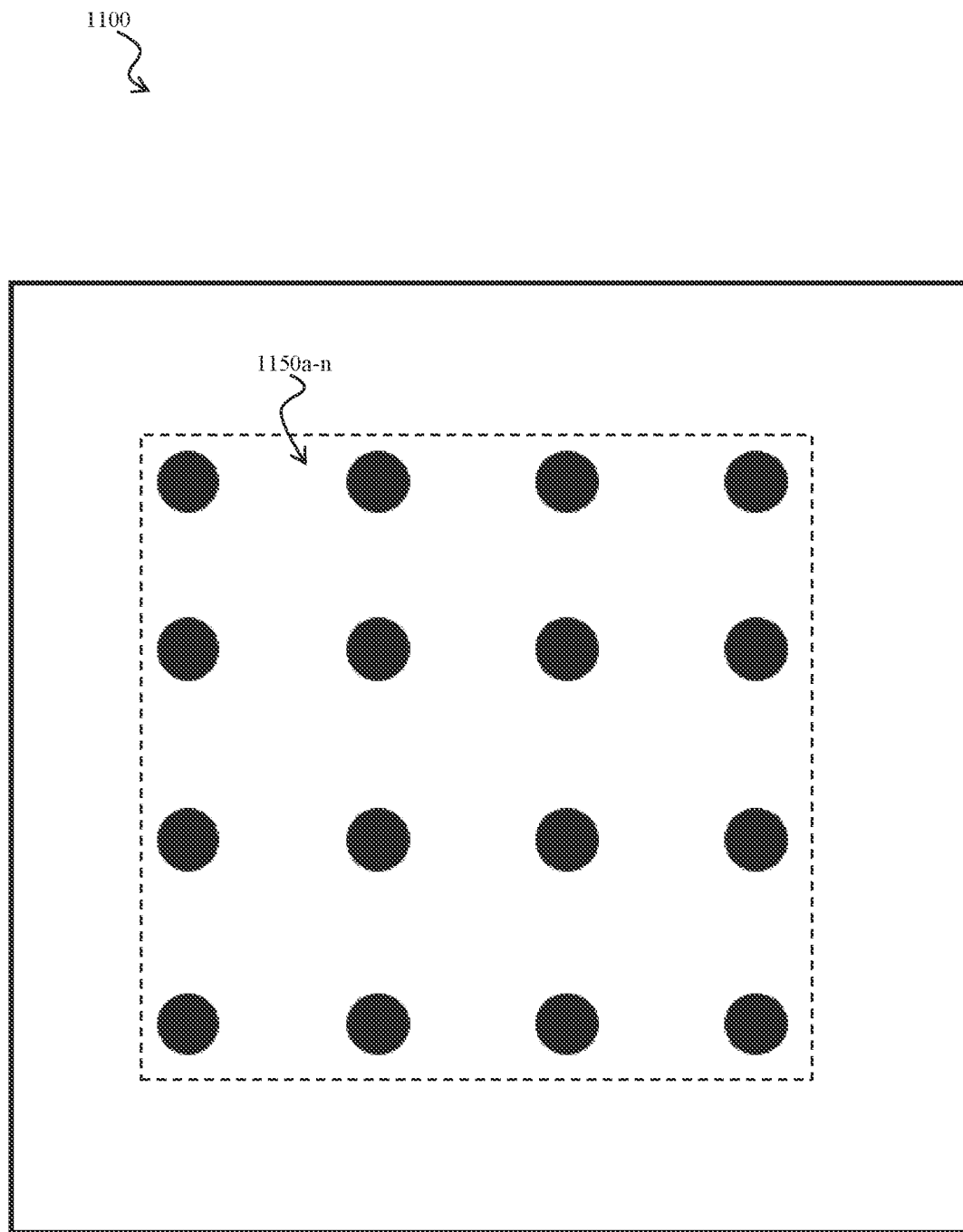
FIG. 12 shows an exemplary testing PCB and the pads on the exemplary testing PCB, for use with the multi-layer implementation shown in FIGS. 7-12.

As shown in FIGS. 11 and 12, pads 1085a-n and 1080a-n on tests-PCB side 1060 of redistribution plate 1000 may match pads 1150a-n on testing PCB 1100, thereby allowing the stacked redistribution plates 800 and 1000 to function as a spatial transformer or redistributor between DUT pads 750a-n and testing PCB pads 150a-n.

In one multi-layer embodiment using multiple redistribution plates, gold stud bumps may be used to connect the multiple redistribution plates and for communication between the multiple redistribution plates.

Figure 13:
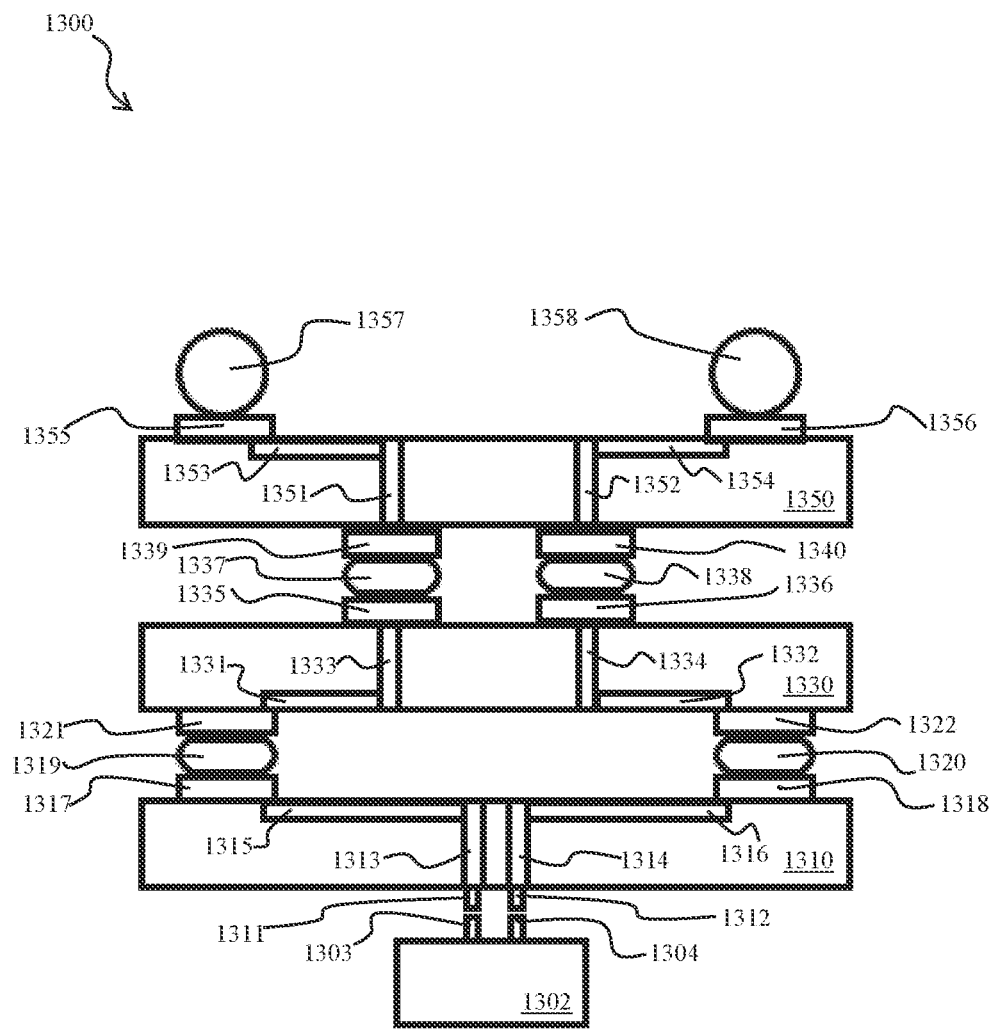
FIG. 13 shows an ultra-simplified cross section of an exemplary mu aver implementation having three redistribution plates.

FIG. 13 is a cross section of a very simple exemplary multi-layer assembly as disclosed herein. FIG. 13 shows a DUT 1302 with two pads 1303 and 1304, and three redistribution plates 1310, 1330, and 1350. Pads 1311 and 1312 on redistribution plate 1310 are configured to interface with pads 1303 and 1304 on DUT 1302. Via 1313 and trace 1315 connects pad 1317 to pad 1313, Via 1314 and trace 1316 connects pad 1318 to pad 1312. Gold bumps 1319 and 1320 connect redistribution plate 1310 to redistribution plate 1330 at pads 1321 and 1322.

Trace 1331 and via 1333 connect pad 1321 to pad 1335. Trace 1332 and via 1334 connect pad 1322 to pad 1336. Gold bumps 1337 and 1337 connect redistribution plate 1330 to redistribution plate 1350 at pads 1339 and 1340. At redistribution plate 1350, via 1351 and trace 1353 connect pad 1339 to pad 1355. Via 1352 and trace 1354 connect pad 1340 to pad 1356. Ball gate array comprising balls 1357 and 1358 allows for interfacing redistribution plate 1350 to a testing PCB.

Figure 14:
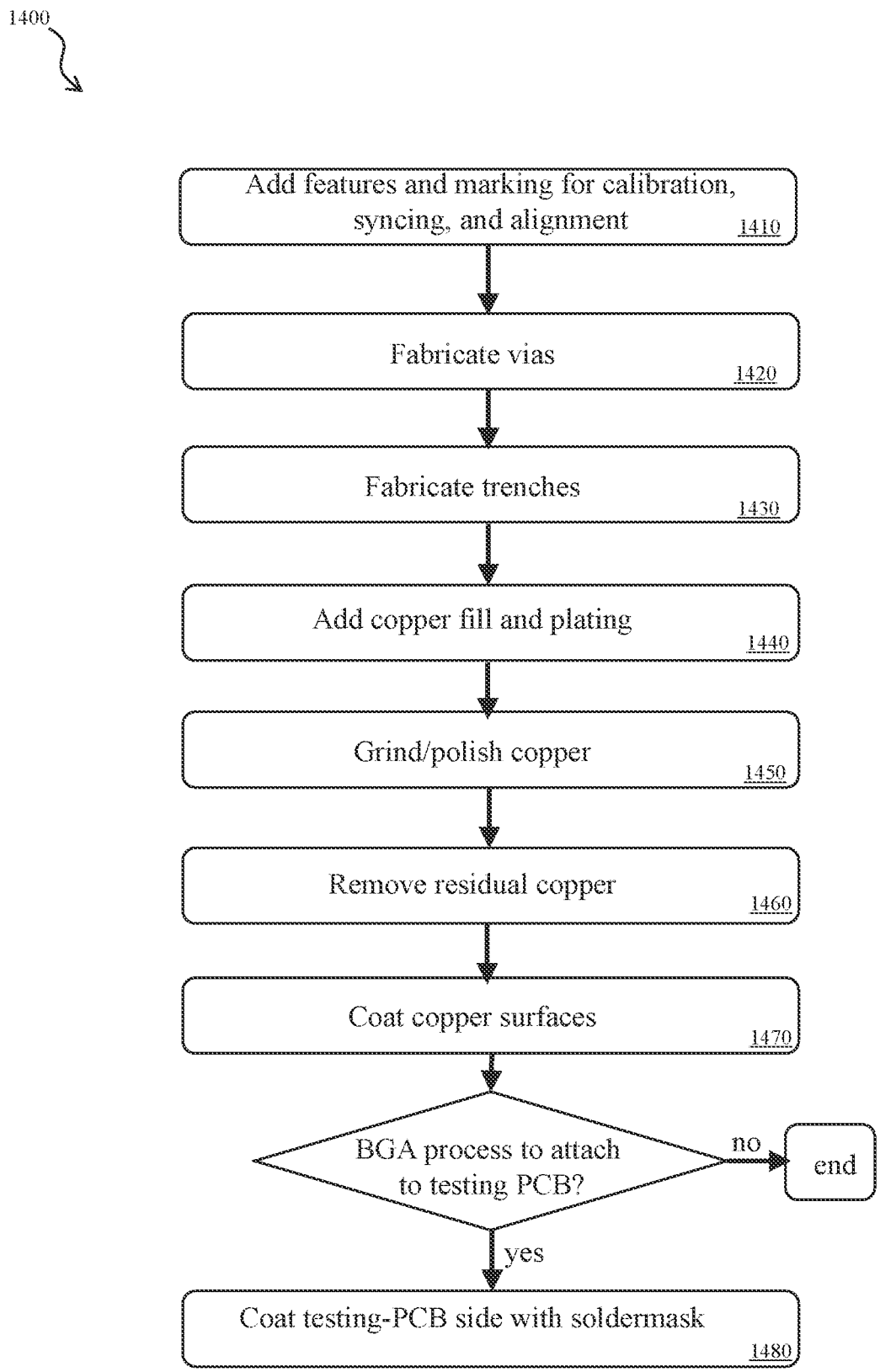
FIG. 14 depicts a flow chart for an exemplary process for fabricating a redistribution plate as described herein.

A person of ordinary skill will appreciate that the fundamental redistribution invention disclosed herein may be applied to and/or implemented for many designs that vary in feature size, feature shape, density and pitch, and other characteristics for a DUT, redistribution plate, and testing PCB, Fabrication Process FIG. 14 shows an exemplary process for fabricating a redistribution plate, e,g., redistribution plate 300 in FIGS. 13 and 14. Although multiple steps are disclosed, and some steps are described as having multiple sub-steps, alternative steps, and/or optional steps, the process disclosure below should not be construed to require any steps, sub-steps, alternative steps, and/or optional steps except as explicitly indicated.

As described herein above, a redistribution plate substrate may comprise a premade hard ceramic plate made at least in part from silicon nitride or other ceramics, polymeric materials such as FR4, quartz, or similar materials suitable for a substrate known in the art.

At step 1410, substrate orientation and through fiducials are defined and marked on both sides of a redistribution plate substrate. This enables calibration of patterns on the top side with the patterns on the bottom side. In general, it does not matter which side is marked first. Other techniques may be used for calibration and to sync features on one side of the redistribution plate with features on the other side of the redistribution plate.

At step 1420, through vias may be fabricated on the redistribution plate. In one embodiment, through vias may be laser milled at the probe pad locations (e.g., 340a-n in FIG. 3) and at the testing-PCB (e.g., BGA) attach locations (e.g., 350a-n in FIG. 3). In one embodiment, the following parameters may be used for laser milling the vias: 355 nm wavelength UV laser, 5 W at 30%, 5 um spot size, and a 50 mm is scan speed. A person of ordinary skill will appreciate that these parameters may be adjusted and still successfully laser mill vias. After milling the through vias. it may be important to verify the geometry and taper of the vias, the accuracy of via placement in reference to their nominal positions, and to remove any substrate melt and/or debris from the milling process.

Vias may be circles, rectangles, or other shapes. For example, in some embodiments, a via may be a 30 um-diameter circle, or a 30 um×30 um square, or a 30 um×50 um rectangle. One consideration for via shape may be amount of fill material. In general, conductive properties of a via improve with increased fill material, and a 30 um×30 um×square may therefore be more desirable than a 30 um-diameter circle. Size, shape, orientation, and location of vias will often be dictated, constrained, and/or affected by the locations, dimensions, densities, and/or characteristics of other features.

At step 1430, trenches are fabricated on the redistribution plate substrate. In generally, trenches are fabricated on one side of the redistribution plate, the redistribution plate is flipped, and trenches are then fabricated on the other side using through fiducials or another technique/feature for alignment and placement relative to features on the opposite side. Although trenches could be fabricated in a different order, it is generally more efficient to fabricate all trenches on a first side, flip the redistribution plate, and then fabricate all trenches on the second side. As shown in FIGS. 3 and 4, the trenches will become traces 345*a-n* and 375*a-n* after being filled with copper.

In one embodiment, laser milling may be used to fabricate trenches. Laser milling parameters for trench fabrication may include: 355 nm wavelength UV laser, 20 W varying between 30-40%, spot size varying between 12-15 um, and scan speeds between 20-55 mm/s. A person of ordinary skill will appreciate that these parameters may be adjusted and still successfully laser mill trenches.

Additionally, the pads (e.g., 335*a-n*, 385*a-n*, and 380*a-n* in FIGS. 3 and 4) may also be fabricated at this step, using the same or similar techniques as for trenches.

Alternatively, a fluorine-based plasma process may be used to fabricate vias, trenches, and/or pads.

In one embodiment, the trenches may be 25 um deep, and trench width may be 15-30 um. A person of ordinary skill in the art will appreciate design, fabrication, and functionality considerations in adjusting trench depth and/or width.

In genera e order for milling/fabricating vias, trenches, and pads is modifiable and may be changed.

At step 1440, the redistribution plate is coated on both sides with electroplated copper. Although copper is generally recognized and used as the most suitable conductor, it is possible that an alternative conductive material could be used. Prior to plating, the substrate surface is prepared by removing extraneous particles to ensure that the copper adheres to the substrate (redistribution plate). Several options may be used for this preparation step. In one embodiment, a solvent clean/activator pre-treatment and an electroless copper seed layer may be used. In another embodiment, a surface pretreatment with oxygen plasma followed by an argon plasma and copper sputter of a seed layer may be used. Typical oxygen plasma conditions may be: 13.56 Mz plasma at 100 W power, 50 sccm of oxygen flow rate for 30 seconds. Other seeding technologies may be known in the art.

After preparation/cleaning, the redistribution plate is coated on both sides with electroplated copper. In one embodiment, both sides of the redistribution plate are coated simultaneously. Although not required, simultaneous coating of both sides of the redistribution plate may be faster than non-simultaneous coating and/or may improve via fill.

It is generally important to tune and optimize the surface treatments, seed layer deposition, and bulk copper plating processes to ensure that all vias, pads, and trenches (traces) are filled completely and do not have voids. In some embodiments it may be beneficial, for good measure, to plate the copper a little thicker than necessary to ensure that features are completely filled. A person of ordinary skill will appreciate such tuning and optimization depending on the particular design, material, and or fabrication constraints and/or environment.

At step 1450, the copper on each side of the redistribution plate is ground and/or polished to be flush with the substrate (redistribution plate). Caution and care in this step are important to avoid damage to the substrate surface. A careful grind/polish may be achieved using a combination of grinding and polishing steps with various materials and chemicals. High selectivity between the grinding/polishing rates of the substrate relative to copper is also beneficial. Most ceramics, including silicon nitride, have a very high selectivity relative to copper.

In one embodiment, grinding may be accomplished using a rotary grinding tool, e.g., a rotary platter to which a grinding or polishing surface may be secured. Optimal rotational speeds may be 150-300 rpm, but other speeds may be used. Using the rotary tool, grinding/polishing may be accomplished by using 400-1200 grit pads, slurries (0.5 um diamond slurry (e.g., ULTRA-SOL STD0.5μ50M); aluminum oxide slurry for improved surface finish and to remove metal traces (e.g, ACUPLANE™ LK393C4 NG3 SLURRY)). Grit pads and slurries may be applied iteratively as necessary to achieve acceptable results. Other grinding/polishing technologies known in the art may also be used.

At step 1460, the unpatterned substrate surface on each side of the redistribution plate may be further cleaned in a chemical etch solution to remove residual metal traces. In one embodiment, the etch solution may be a dilute solution of ammonium persulfate.

At step 1470, the copper surfaces (traces, vias, pads) may be protected from oxidation and handling by coating with nickel and gold using the well-established ENIG process, in which the copper is coated with about 4 um of electroless nickel followed by a thin layer of electroless gold. If necessary, in some embodiments hard gold can be applied using an electrolytic process for further protection.

At optional step 1480, if the subsequent attachment of the redistribution plate to the testing PCB will be with a BGA process, it may be necessary to coat the testing-PCB side of the redistribution plate (e.g., testing-PCB side 360 in FIG. 4) with a soldermask, which may provide an additional layer of protection from handling defects.

In one alternative photolithography with plasma etching may be used in whole or in part to fabricate features including vias, trenches, and pads on one or both sides of a redistribution plate. In another alternative dry etch of substrates using proprietary fluorine-based etch conditions may be used in whole or in part to fabricate features including vias, trenches, and pads on one or both sides of a redistribution plate.

A person of ordinary skill in the art will appreciate that careful design of features on the redistribution plate will facilitate void-free filling of traces and vias.

The current invention differs from the present state-of-the-art in a few respects: (i) A single-level dual-sided space transformer is shown for the first time for probe pad pitches of 40 um or smaller; (ii) A single level, dual-sided plate is processed wherein trenches are made into the substrate on either side. Traces are NOT made in subsequent add-on layers; (iii) Readily available substrates in stock are used; (iv) a single-step metallization process is used to fill the traces (trenches) on both sides and through vias simultaneously.

In general, the disclosed single-layer redistribution plate, and the processes for fabricating such, have many advantages over an MLC or MLO space transformer: A single-layer redistribution plate as disclosed herein may be less expensive to fabricate, may require fewer process steps (fewer layers), may be more simple, may use less expensive materials, may require shorter design and/or fabrication, and may result in a thinner final product that is easier to use and results in decreased probe depth (which is often a restriction depending on the characteristics of a particular application).

What is claimed is:
1. An apparatus comprising a circuit board substrate having a first side and a second side, wherein:
the first side comprises a DUT pad and a DUT via;
the greatest dimension of the DUT pad is less than 40 um;
the greatest dimension of the DUT via is less than 40 um;
the DUT pad is conductively connected by a first trace on the first side of the circuit board to a first via that goes through the circuit board and is conductively connected to a first test pad on the second side of the circuit board;

the DUT via is conductively connected through the circuit board to a second trace on the second side of the circuit board, and the second trace is conductively connected to a second test pad on the second side of the circuit board;

the area of the first test pad is at least twice the area of the DUT pad; and the area of the second test pad is at least twice the area of the DUT via.

* * * * *